(12) United States Patent
Bollu

(10) Patent No.: US 8,441,882 B2
(45) Date of Patent: *May 14, 2013

(54) MEMORY DEVICES HAVING REDUNDANT ARRAYS FOR REPAIR

(75) Inventor: Vikram Bollu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/351,575

(22) Filed: Jan. 17, 2012

(65) Prior Publication Data

US 2012/0113739 A1    May 10, 2012

Related U.S. Application Data

(63) Continuation of application No. 12/985,236, filed on Jan. 5, 2011, now Pat. No. 8,111,578, which is a continuation of application No. 12/259,218, filed on Oct. 27, 2008, now Pat. No. 7,876,639.

(51) Int. Cl.
*G11C 8/00* (2006.01)

(52) U.S. Cl.
USPC ............. 365/230.02; 365/230.03; 365/189.02

(58) Field of Classification Search ............. 365/230.02, 365/230.03, 189.02, 200, 201
See application file for complete search history.

(56) References Cited

U.S. PATENT DOCUMENTS

| | | | |
|---|---|---|---|
| 5,732,030 A | 3/1998 | Dorney | |
| 5,822,268 A | 10/1998 | Kirihata | |
| 6,240,046 B1 | 5/2001 | Proebsting | |
| 6,490,208 B2 | 12/2002 | Yoon | |
| 6,522,590 B2 | 2/2003 | Matsui et al. | |
| 6,724,669 B1 | 4/2004 | Bhatia | |
| 7,580,295 B2 * | 8/2009 | Lee et al. | 365/189.02 |
| 7,817,491 B2 | 10/2010 | Kwak | |
| 7,876,639 B2 | 1/2011 | Bollu | |
| 8,111,578 B2 * | 2/2012 | Bollu | 365/230.02 |

* cited by examiner

*Primary Examiner* — David Lam

(74) *Attorney, Agent, or Firm* — Knobbe, Martens, Olson & Bear, LLP

(57) ABSTRACT

Apparatus and methods are disclosed, such as those involving a memory device. One such memory device includes a memory array including a sub-array that includes a first number of columns of memory cells, and one or more global input/output (I/O) lines shared by the first number of columns for data transmission. The memory device also includes one or more multiplexers/demultiplexers, wherein each of the multiplexers/demultiplexers is electrically coupled to one or more, but not all, of the global I/O lines. The memory device further includes a plurality of local I/O lines, each configured to provide a data path between one of the multiplexers/demultiplexers and one or more, but less than the first number, of the columns in the sub-array. This configuration allows local I/O line repairability with fewer redundant elements, and shorter physical local I/O lines, which translate to improved speed and die size reduction.

20 Claims, 5 Drawing Sheets

MEMORY DEVICES HAVING REDUNDANT ARRAYS FOR REPAIR

CROSS-REFERENCE TO RELATED APPLICATIONS

This application is a continuation of U.S. patent application Ser. No. 12/985,236, filed Jan. 5, 2011, issued as U.S. Pat. No. 8,111,578, which is a continuation of U.S. patent application Ser. No. 12/259,218, filed Oct. 27, 2008, issued as U.S. Pat. No. 7,876,639 on Jan. 25, 2011, the disclosures of each of which are hereby incorporated by reference in their entireties herein.

BACKGROUND OF THE INVENTION

1. Field of the Invention

Embodiments of the invention relate to solid state memory devices, and more particularly, in one or more embodiments, to repair of defective memory elements.

2. Description of the Related Art

Solid state memory devices have been widely used as data storage in various electronic devices. Types of solid state memory devices include volatile memories (for example, dynamic or static random access memories) and non-volatile memories (for example, read-only memories and flash memories).

FIG. 1 is a block diagram of a conventional solid state memory device 100. The illustrated memory device 100 is a dynamic random access memory (DRAM). The memory device 100 includes a memory array 102 to store data. The illustrated memory array 102 includes four memory banks 104a-104d (Bank 1 to Bank 4). A skilled artisan will, however, appreciate that the number of memory banks is not limited to a particular number, and that the number can vary widely, depending on the design of the memory device. Each of the memory banks 104a-104d includes an array of regular memory cells arranged in rows and columns. The memory device 100 may also include redundant memory arrays that include redundant memory cells. The redundant memory cells may be used to replace defective regular memory cells.

The memory device 100 also includes an address register 112, a row address multiplexer 114, a bank control logic circuit 116, and row address latch and decoder circuits 118a-118d. Each of the row address latch and decoder circuits 118a-118d is typically associated with a respective memory bank 104a-104d. The memory device 100 also includes a column address counter/latch 120, column decoders 122a-122d, a command execution logic circuit 130, and an address input 133. Each of the column decoders 122a-122d is typically associated with a respective memory bank 104a-104d. The memory device 100 further includes sense amplifiers 106a-106d, a column circuit 124, a data input register (or buffer) 126, and a data output register (or buffer) 128. Each of the sense amplifiers 106a-106d is typically associated with a respective memory bank 104a-104d. The memory device 100 also includes a status register 150.

The address input 133 receives address signals A0-A11 and bank address signals BA0, BA1 from an associated electronic device (for example, a CPU in a computer) through an address bus 134. The address register 112 may initially receive a row address and provide it to the row address multiplexer 114. The row address multiplexer 114 typically passes the row address to a selected one of the row address latch and decoder circuits 118a-118d, according to the state of the bank address signals. The selected one row address latch and decoder circuit stores the row address and applies various signals to the associated memory bank, thereby accessing a selected row address.

The address register 112 also receives a column address through the address input 133, and provides it to the column address counter/latch 120. The column address counter/latch 120 provides the column address to one of the column decoders 122a-122d, depending on the state of the bank address signals. The one column decoder provides the column address to the column circuit 124. The column circuit 124 provides signals to the selected memory bank to access a selected set of memory cells in the memory bank 104a-104d. Data can be written in the selected set of memory cells through the data input register 126 via a data port 143. The data port 143 can include a plurality of pins DQ0-DQ15 to provide data in a parallel form. Alternatively, data can be read from a selected set of memory cells through the data output register 128 and the data port 143.

The command execution logic circuit 130 serves to control the operations of the memory device 100 upon receiving various signal, including a clock enable signal CKE, a clock signal CLK, a chip select signal CS#, a write enable signal WE#, a column address strobe signal CAS#, and a row address strobe signal RAS#. The command execution logic circuit 130 can include a state machine 131 and a mode register 132. The state machine 131 and the mode register 132 together serve to control states of operations performed on the memory array 102.

Referring to FIG. 2A, an example memory bank in the memory array of a conventional memory device will be described. Each of the banks 104a-104d of FIG. 1 can have the same configuration as the bank 200 shown in FIG. 2A. The illustrated memory bank 200 includes first and second half banks 201a, 201b. Each of the half banks 201a, 201b includes a first block 202a and a second block 202b. Each of the first and second blocks 202a, 202b includes sub-arrays 210 of memory cells. Each of the half banks 201a, 201b can also include global redundant sub-arrays 250 between the first and second blocks 202a, 202b.

Referring to FIG. 2B, a portion of the memory bank 200 of FIG. 2A will be described. For example, the portion of the memory bank can include four sub-arrays 210 that are arranged vertically, as indicated by 2B in FIG. 2A. The illustrated portion of the memory bank 200 includes first to fourth sub-arrays 210a-210d, first and second global input/output (I/O) lines 230a, 230b, and first to fourth local input/output (I/O) lines 240a-240d.

Each of the sub-arrays 210a-210d may include first to fourth cores 220a-220d. Each of the cores 220a-220d may include memory cells arranged in a matrix form. The details of the cores 220a-220d will be described in connection with FIG. 2C.

The global I/O lines 230a, 230b serve to transmit data between the local I/O lines 240a-240d and the data port of the memory device (for example, the data port 143 in FIG. 1). The global I/O lines 230a, 230b extend in a column direction in the illustrated example. The first global I/O line 230a extends in a gap between the first and second cores 220a, 220b of the sub-arrays 210a-210d. The second global I/O line 230b expends in a gap between the third and fourth cores 220c, 220d of the sub-arrays 210a-210d. The global I/O lines 230a, 230b may be positioned at a different elevation from the cores 220a-220d. For example, each of the global I/O lines 230a, 230b may include four lines for transmission of four data digits.

The local I/O lines 240a-240d serve to transmit data between the cores 220a-220d and the global I/O lines 230a, 230b. The local I/O lines 240a-240d extend in a row direction in the illustrated example. The first local I/O line 240*a* extends in a space between the first and second sub-arrays 210*a*, 210*b*. The second local I/O line 240*b* extends in a space between the second and third sub-arrays 210*b*, 210*c*. The third local I/O line 240*c* extends in a space between the third and fourth sub-arrays 210*c*, 210*d*. The fourth local I/O line 240*d* extends in a space between the fourth sub-array 210*d* and another sub-array (not shown) below the fourth sub-arrays 210*d*. The local I/O lines 240*a*-240*d* may be positioned at an elevation the same as or different from the cores 220*a*-220*d* and the global I/O lines 230*a*, 230*b*. For example, each of the local I/O lines 240*a*-240*d* includes four lines for transmission of four data digits.

Referring to FIG. 2C, one of the sub-arrays and adjacent local and global I/O lines of the portion depicted in FIG. 2B will be described in more detail along with a global redundant sub-array. The illustrated portion includes a sub-array 210, first to eighth sense amplifiers 225*a*-225*h*, first and second global I/O lines 230*a*, 230*b*, first and second local I/O lines 240*a*, 240*b*, and first to fourth read/write gap circuits 275*a*-275*d*. The sub-array 210 may include first to fourth cores 220*a*-220*d*. The first to fourth sense amplifiers 225*a*-225*d* can be referred to as top sense amplifiers, and the fifth to eighth sense amplifiers 225*e*-225*h* can be referred to as bottom sense amplifiers in the context of this document. The illustrated portion also includes a global redundant sub-array 250 and a local redundant array 260 for the repair of defective memory cells or columns.

Each of the cores 220*a*-220*d* includes an array of memory cells (not shown), data lines (such as digit lines B1-Bn, T1-Tn), and access lines (such as word lines; not shown). The data lines extend in a column direction, and are coupled to memory cells arranged in the column direction. The access lines extend in a row direction that is perpendicular to the column direction, and are coupled to memory cells arranged in the row direction. In the illustrated example, the data lines includes top data lines T1-Tn, and bottom data lines B1-Bn. The top data lines T1-Tn of one of the cores 220*a*-220*d* are coupled to the top sense amplifier 225*a*-225*d* adjacent to the core while the bottom data lines B1-Bn of the core are coupled to the bottom sense amplifier 225*e*-225*h* adjacent to the core. The cores 220*a*-220*d* are arranged in a row direction. In the illustrated example, each of the cores 220*a*-220*d* may include 256 data lines: 128 top data lines and 128 bottom data lines. In the illustrated example, a single "column" may refer to a group of eight (8) adjacent data lines.

The sense amplifiers 225*a*-225*h* are coupled to either the first or second local I/O line 240*a*, 240*b*. In the illustrated example, the top sense amplifiers 225*a*-225*d* are coupled to the first local I/O line 240*a* whereas the bottom sense amplifiers 225*e*-225*h* are coupled to the second local I/O line 240*b*. The sense amplifiers 225*a*-225*h* are configured to detect the data levels of selected memory cells in the cores 220*a*-220*d* and transmit them to the local I/O lines 240*a*, 240*b* during read operation.

The first and second global I/O lines 230*a*, 230*b* extend in the column direction. The details of the first and second global I/O lines 230*a*, 230*b* can be as described earlier in connection with FIG. 2B.

The first local I/O line 240*a* includes first to fourth lines LIO1-LIO4 that extend in the row direction across a first region 223*a* that is outside the cores 220*a*-220*d* and adjacent to the first to fourth sense amplifiers 225*a*-225*d*. The second local I/O line 240*b* includes fifth to eighth lines LIO5-LIO8 that extend in the row direction across a second region 223*b* that is outside the cores 220*a*-220*d* and adjacent to the fifth to eighth sense amplifiers 225*e*-225*h*. The details of the first and second local I/O lines 240*a*, 240*b* can be as described above in connection with FIG. 2B.

The first to fourth read/write gap circuits 275*a*-275*d* provide electrical connection between the local I/O lines 240*a*, 240*b* and the global I/O lines 230*a*, 230*b*. In the illustrated example, the first read/write gap circuit 275*a* electrically couples the third and fourth lines LIO3, LIO4 of the first local I/O line 240*a* to the first global I/O line 230*a*. The second read/write gap circuit 275*b* electrically couples the first and second lines LIO1, LIO2 of the first local I/O line 240*a* to the second global I/O line 230*b*. The third read/write gap circuit 275*c* electrically couples the fifth and sixth lines LIO5, LIO6 of the second local I/O line 240*b* to the first global I/O line 230*a*. The fourth read/write gap circuit 275*d* electrically couples the seventh and eighth lines LIO7, LIO8 of the second local I/O line 240*b* to the second global I/O line 230*b*.

The global redundant sub-array 250 includes columns of memory cells that can replace defective columns of memory cells in the cores 220*a*-220*d*. In the context of this document, the term "defective column" refers to a column that has one or more defective memory cells. In the illustrated example, the global redundant sub-array 250 includes 32 columns, that is, 256 data lines (for example, 128 top data lines and 128 bottom data lines). The global redundant sub-array 250 may have the same configuration as one of the cores 220*a*-220*d*. The global redundant sub-array 250 can be provided with its own sense amplifiers 227*a*, 227*b*. Data digits may be read from or written onto the memory cells in the global redundant sub-array 250 directly via a separate set of global I/O lines and local I/O lines. In the illustrated example, each bank (for example, 200 of FIG. 2A) includes four global redundant sub-arrays (32× 4=128 columns) of the same configuration. The four global redundant sub-arrays form a global redundant array that can collectively repair one of the sub-arrays 210 (four 32-column cores=128 columns) in its entirety when there is a defective local I/O line that prevents access to the sub-array. For each group of four sub-arrays 210, there can be one global redundant sub-array 250, as shown in FIG. 2A although only one sub-array 210 and one global redundant sub-array are depicted in FIG. 2C.

The local redundant array 260 may include a column(s) of memory cells that can replace a defective column(s) of memory cells in the cores 220*a*-220*d*. The local redundant array 260 may have a less number of columns than one of the cores 220*a*-220*d*. The local redundant array 260 can be provided with its own sense amplifiers 228*a*, 228*b*. Data digits may be read from or written onto the local redundant array 260 directly via a separate set of global I/O lines and local I/O lines. The local redundant array 260 may be used when two or more of the sub-arrays 210 (for example, in FIG. 2A) include defective columns at the corresponding column addresses.

During a read or a write operation, a column address and a row address are provided to the memory device, as described above in connection with FIG. 1. The column address selects a column in one of the cores 220*a*-220*d*. The column can include, for example, eight adjacent data lines in the core. For example, a column address can select four top data lines and four bottom data lines alternating with one another in one of the cores 220*a*-220*d*. The row address selects a single word line coupled to a row of memory cells.

During read operation, the memory cells coupled to the selected data lines and word line are electrically coupled to a respective one of the sense amplifiers 225*a*-225*d*. The sense amplifier 225*a*-225*d* detects the data levels stored in the memory cells. The detected data levels are transmitted as data digits to the global I/O lines 230*a*, 230*b* via the local I/O lines 240a, 240b and the first to fourth read/write gap circuits 275a-275d. For example, the data levels on selected eight memory cells in the first core 220a can be read by the first and fifth sense amplifiers 225a, 225e, and transmitted to the global I/O lines 230a, 230b via the first and second local I/O lines 240a, 240b and the first to fourth read/write gap circuits 275a-275d.

Similarly, during write operation, data is transferred from the global I/O lines 230a, 230b to the local I/O lines 240a, 240b via the read/write gap circuits 275a-275d. The data is then written to the memory cells coupled to the selected data lines and word line.

During production of a memory device, a test is typically performed to determine if there is any defect in the memory device. In certain instances, one or more local I/O lines in the memory device may have a defect. In such instances, a sub-array that uses the defective local I/O line for data transmission cannot be accessed. In the example shown in FIG. 2C, such a sub-array (that includes four cores 220a-220d having a total of 128 columns) can be replaced in its entirety with the four global redundant sub-arrays 250 (having a total of 128 columns) in the bank 200 (FIG. 2A).

BRIEF DESCRIPTION OF THE DRAWINGS

The embodiments will be better understood from the Detailed Description of Embodiments and from the appended drawings, which are meant to illustrate and not to limit the embodiments, and wherein.

DETAILED DESCRIPTION OF EMBODIMENTS

Memory devices can have defects, rendering at least a portion of them unusable. Such defects may be a result of a random error or a systematic error. To repair defects in memory devices and improve yield, memory devices may typically include redundant memory elements that may replace defective elements. Such redundant memory elements may be implemented in rows, columns, or combinations thereof. Redundant memory elements may also be implemented locally, globally, or in combinations of the same.

Memory repair may be performed, for example, by conducting the following steps. First, memory elements in a memory device are tested to identify defective memory elements, for example, a defective column. If a defective memory element is found, the address decoder of the memory device may be configured to map an address to a defective column to a redundant column.

Figure 1:
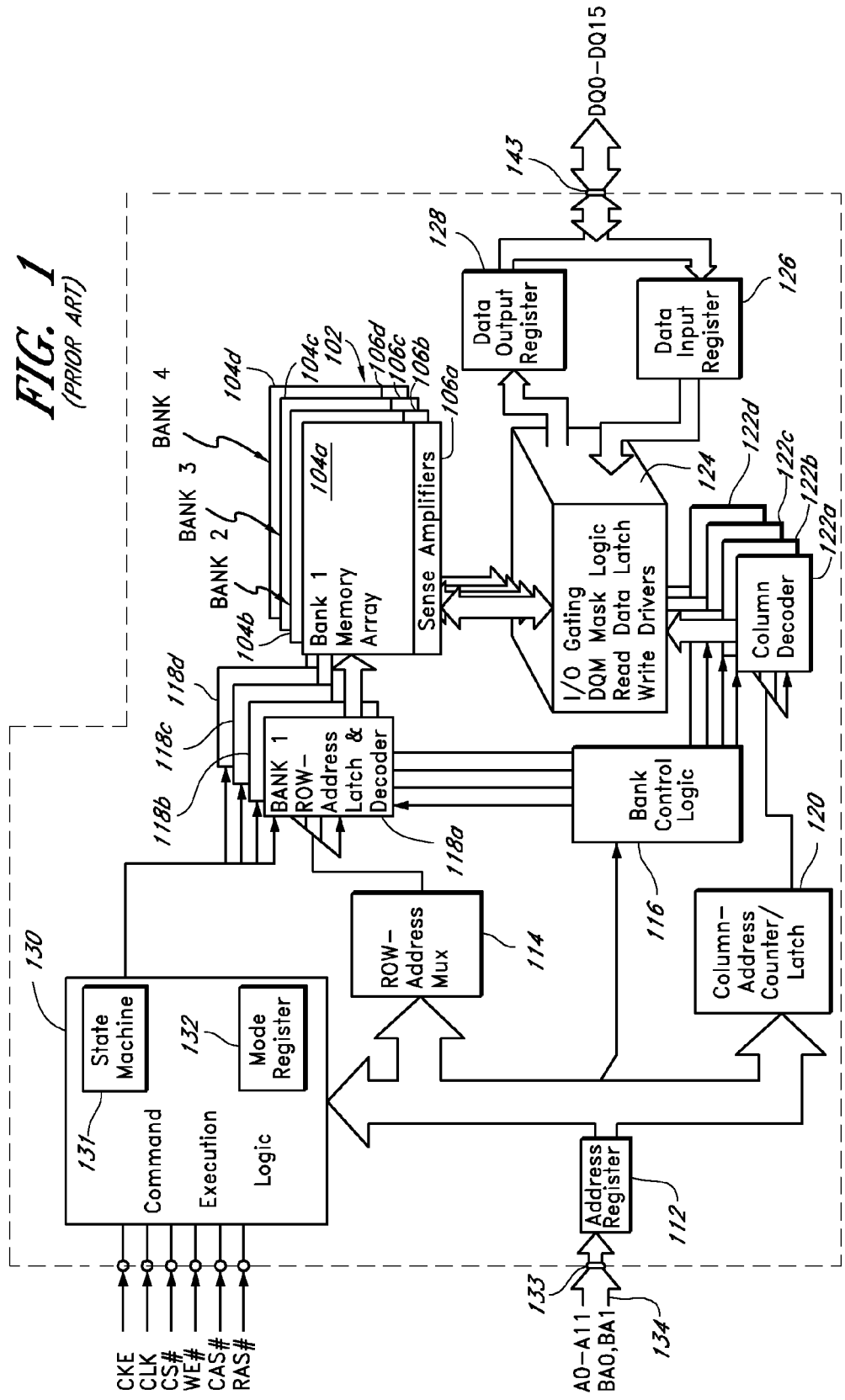
FIG. 1 is a block diagram of a conventional memory device.
Figure 2A:
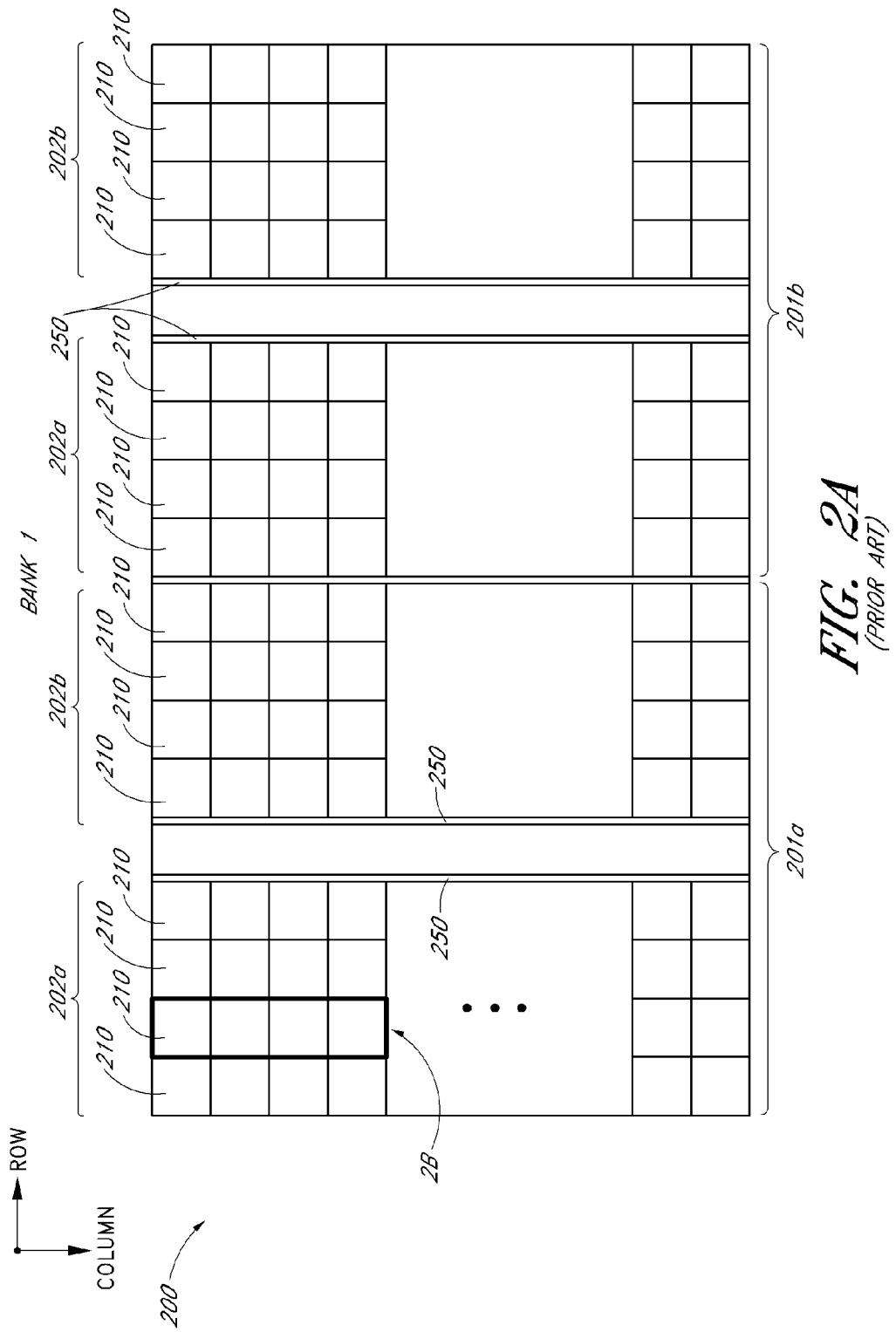
FIG. 2A is a block diagram of a bank of a conventional memory device.
Figure 2B:
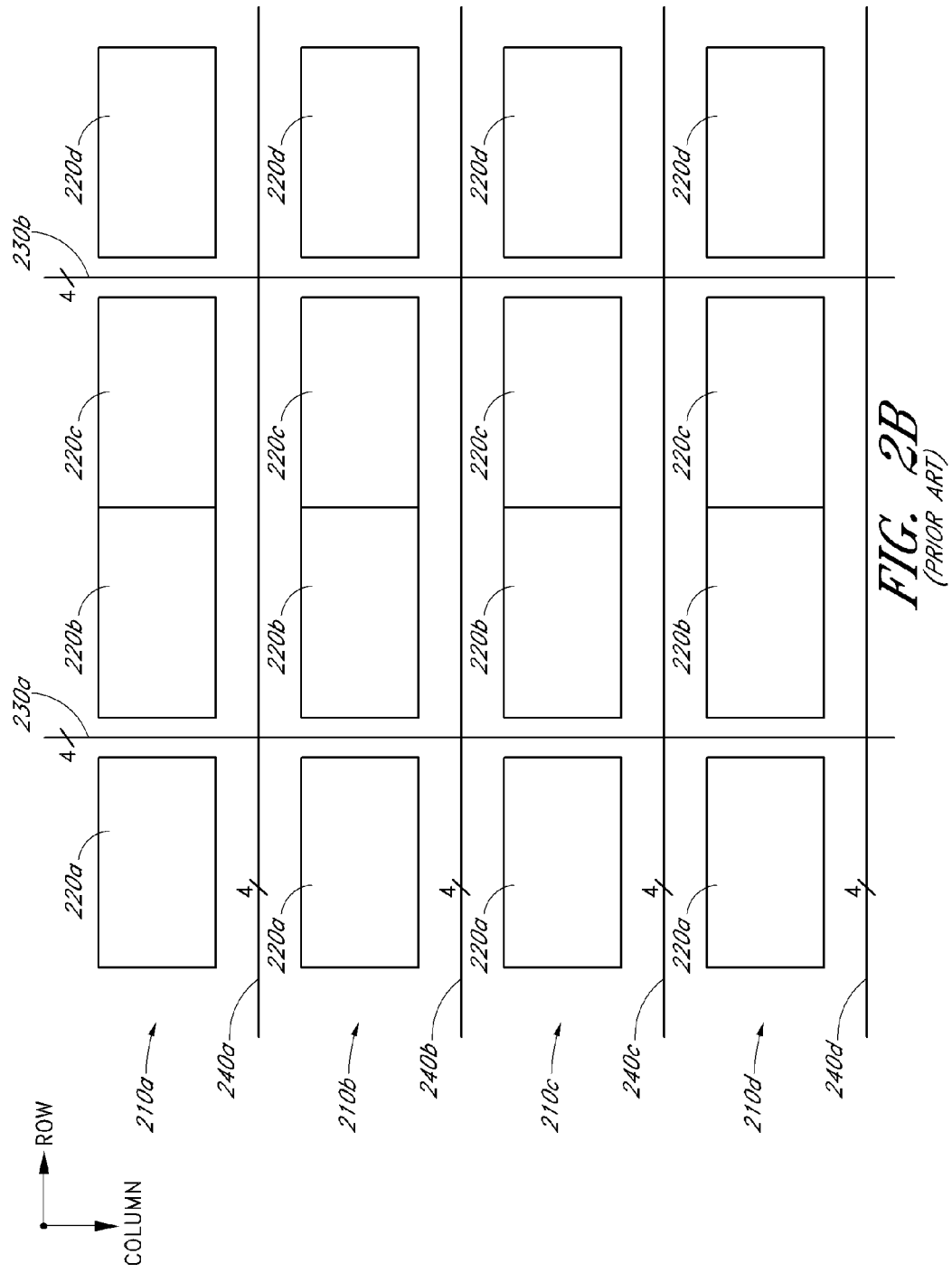
FIG. 2B is a block diagram of a portion of the bank of FIG. 2A that includes a group of four sub-arrays.

In a conventional memory device, as described earlier in connection with FIGS. 1-2C, when a local I/O line in the memory device has a defect, the entire sub-array 210 that uses the local I/O line needs to be replaced with a global redundant array (that is, four global redundant sub-arrays 250 in the bank 200 of FIG. 2A). Thus, the global redundant array should have the same number of columns as the number of columns in a sub-array. Such a global redundant array occupies a substantial amount of space in the memory device. Thus, there is a need for a scheme that can reduce the space used for the global redundant array while not adversely affecting the repair capability.

In one embodiment, a memory device includes a memory array that includes one or more banks. Each of the banks may include a plurality of sub-arrays, each of which includes a plurality of columns (for example, 128 columns) of memory cells. The columns in a sub-array may be divided into two or more segments. The memory device may also include one or more global input/output (I/O) lines that are shared by the columns in the sub-array; and one or more multiplexers. Each of the multiplexers is electrically coupled to a respective one of the global I/O lines. In the embodiments described below, the term "multiplexer" refers to a bi-directional device and may be referred to as a "multiplexer/demultiplexer."

The memory device also includes a plurality of local I/O lines. Each of the local I/O lines is configured to provide a data path between one of the multiplexers and the columns in one of the segments in the sub-array. When there is a defect in one of the local I/O lines, only the segment that is accessed via the defective local I/O line needs to be replaced. Thus, the size of a global redundant array in the memory device can be significantly reduced.

Figure 3:
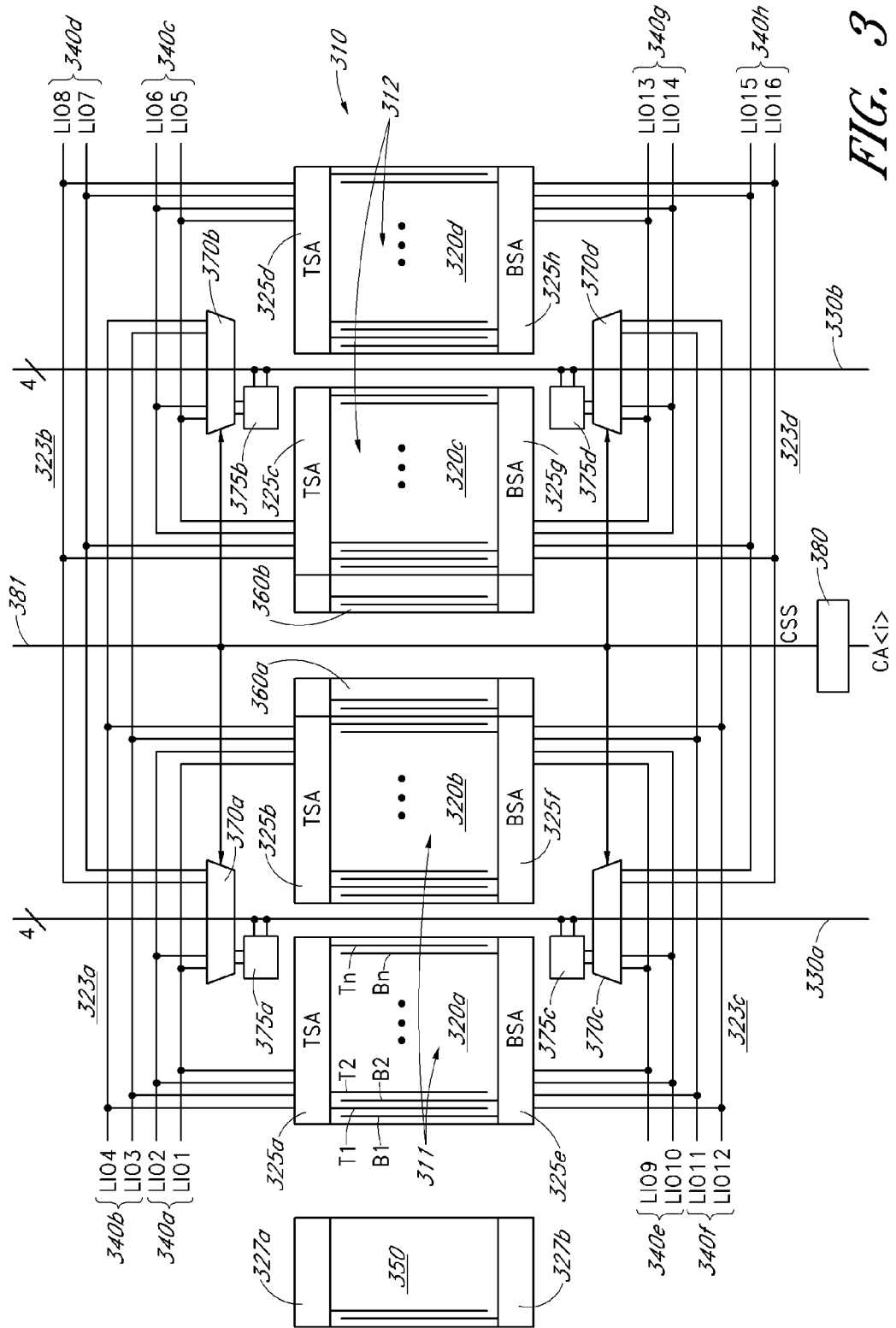
FIG. 3 is a block diagram of one of sub-arrays of one of the banks of a memory device according to one embodiment.

Referring to FIG. 3, a portion of a memory device according to one embodiment will be described. The memory device may include components that are described above in connection with FIG. 1. The memory device may include, among other things, a memory array that includes one or more memory banks. The configuration of the one or more memory banks can be as described above in connection with FIG. 2A. The portion shown in FIG. 3 can be a part of a bank.

The illustrated portion includes a sub-array 310 including first to fourth cores 320a-320d, first to eighth sense amplifiers 325a-325h, first and second global I/O lines 330a, 330b, first to eighth local I/O lines 340a-340h, first to fourth multiplexers 370a-370d, first to fourth read/write gap circuits 375a-375d, a segment selection circuit 380, a segment selection line 381. The illustrated portion also includes a global redundant sub-array 350 and first and second local redundant arrays 360a, 360b for the repair of defective columns in the cores 320a-320d. A skilled artisan will appreciate that the configurations and numbers of the cores, sense amplifiers, global I/O lines, local I/O lines, multiplexers, and read/write gap circuits can vary widely, depending on the design of the memory device. Likewise, the configurations and numbers of the segment selection circuit and the segment selection line can vary, depending on the design of the memory device.

In the context of the illustrated embodiment, the first and second cores 320a, 320b can be collectively referred to as a first segment 311, and the third and fourth cores 320c, 320d can be collectively referred to as a second segment 312. The first to fourth sense amplifiers 325a-325d can be referred to as top sense amplifiers, and the fifth to eighth sense amplifiers 325e-325h can be referred to as bottom sense amplifiers in the context of this document.

In the illustrated embodiment, the first to fourth cores 320a-320d in the sub-array 310 are arranged in a row direction. Each of the cores 320a-320d may include an array of memory cells (not shown), data lines (such as digit lines B1-Bn, T1-Tn), and access lines (such as word lines; not shown). The data lines extend in a column direction that is substantially perpendicular to the row direction, and are coupled to the memory cells arranged in the column direction. The access lines extend in the row direction, and are coupled to the memory cells arranged in the row direction. In the illustrated embodiment, the data lines includes top data lines T1-Tn, and bottom data lines B1-Bn. The top data lines T1-Tn are coupled to one of the top sense amplifier 325a-325d while the bottom data lines B1-Bn are coupled to one of the bottom sense amplifiers 325e-325h.

In the illustrated embodiment, each of the cores 320a-320d includes 256 data lines: 128 top data lines and 128 bottom data lines. A column may refer to a group of eight (8) adjacent data lines. A skilled artisan will appreciate that the numbers of data lines and word lines in a core can vary widely, depending on the design of the cores 320a-320d. In other embodiments, the cores 320a-320d may be consolidated into a single array or more than one array.

The sense amplifiers 325a-325h are coupled to two of the first to eighth local I/O lines 340a-340h. In the illustrated embodiment, the first and second sense amplifiers 325a, 325b may be coupled to the first and second local I/O lines 340a, 340b. The third and fourth sense amplifiers 325c, 325d may be coupled to the third and fourth local I/O lines 340c, 340d. The fifth and sixth sense amplifiers 325e, 325f may be coupled to the fifth and sixth local I/O lines 340e, 340f. The seventh and eighth sense amplifiers 325g, 325h may be coupled to the seventh and eighth local I/O lines 340g, 340h. The sense amplifiers 325a-325h are configured to detect the data levels of selected memory cells in the cores 320a-320d and transfer them to the local I/O lines 340a-340h during a read operation.

The first and second global I/O lines 330a, 330b extend in the column direction. The global I/O lines 330a, 330b serve to transmit data between the local I/O lines 340a-340h and the data port of the memory device (for example, the data port 143 in FIG. 1). The first global I/O line 330a extends across a region between the first and second cores 320a, 320b of the sub-array 310. The second global I/O line 330b extends across a region between the third and fourth cores 320c, 320d of the sub-array 310. The global I/O lines 330a, 330b may be positioned at a different elevation from the cores 320a-320d.

Each of the global I/O lines 330a, 330b may include four lines for transmission of four data digits. The numbers of lines in the global I/O lines 330a, 330b can vary widely, depending on the design of the memory device. In certain embodiments, the global I/O lines 330a, 330b can be consolidated into one set of lines positioned adjacent to one another. A skilled artisan will appreciate that each of the global I/O lines 330a, 330b may include a differential pair of lines, depending on the design of the memory device. Other details of the first and second global I/O lines 330a, 330b can be as described above with respect to the global I/O lines 230a, 230b of FIG. 2B.

The first local I/O line 340a includes first and second lines LIO1, LIO2 that extend in the row direction across a first region 323a that is outside the first and second cores 320a, 320b, and adjacent to the first and second sense amplifiers 325a, 325b. The second local I/O line 340b includes third and fourth lines LIO3, LIO4 that extend in the row direction across the first region 323a and a left half of a second region 323b that is outside the third and fourth cores 320c, 320d, and adjacent to the third and fourth sense amplifiers 325c, 325d. The third local I/O line 340c includes fifth and sixth lines LIO5, LIO6 that extend in the row direction across the second region 323b. The fourth local I/O line 340d includes seventh and eighth lines LIO7, LIO8 that extend in the row direction across the second region 323b, and a right half of the first region 323a.

Similarly, the fifth local I/O line 340e includes ninth and tenth lines LIO9, LIO10 that extend in the row direction across a third region 323c that is outside the first and second cores 320a, 320b, and adjacent to the fifth and sixth sense amplifiers 325e, 325f. The sixth local I/O line 340f includes eleventh and twelfth lines LIO11, LIO12 that extend in the row direction across the third region 323c and a left half of a fourth region 323d that is outside the third and fourth cores 320c, 320d, and adjacent to the seventh and eighth sense amplifiers 325g, 325h. The seventh local I/O line 340g includes thirteenth and fourteenth lines LIO13, LIO14 that extend in the row direction across the fourth region 323d. The eighth local I/O line 340h includes fifteenth and sixteenth lines LIO15, LIO16 that extend in the row direction across the fourth region 323d, and a right half of the third region 323c.

The first multiplexer 370a is configured to selectively couple the first local I/O line 340a or the fourth I/O line 340d to the first read/write gap circuit 375a. The second multiplexer 370b is configured to selectively couple the second local I/O line 340b or the third local I/O line 340c to the second read/write gap circuit 375b. The third multiplexer 370c is configured to selectively couple the fifth local I/O line 340e or the eighth I/O line 340h to the third read/write gap circuit 375c. The fourth multiplexer 370d is configured to selectively couple the sixth local I/O line 340f or the seventh I/O line 340g to the fourth read/write gap circuit 375d. The multiplexers 370a-370d can serve as pass gates to provide bi-directional connection between the local I/O lines 340a-340h and the read/write gap circuits 375a-375d.

The first to fourth read/write gap circuits 375a-375d may provide electrical connection between the multiplexers 370a-370d and the global I/O lines 330a, 330b. In the illustrated embodiment, the first read/write gap circuit 375a electrically couples the first multiplexer 370a to the first global I/O line 330a. The second read/write gap circuit 375b electrically couples the second multiplexer 370b to the second global I/O line 330b. The third read/write gap circuit 375c electrically couples the third multiplexer 370c to the first global I/O line 330a. The fourth read/write gap circuit 375d electrically couples the fourth multiplexer 370d to the second global I/O line 330b. Each of the first to fourth read/write gap circuits 375a-375d may include one or more pass gates, and thus adds a minimal overhead to implement the scheme described in the illustrated embodiment.

The segment selection circuit 380 serves to provide the multiplexers 370a-370d with one or more segment select signals CSS via the segment selection line 381. The segment selection circuit 380 is configured to decode a column address CA<i> and generate the segment select signals CSS. The segment select signals CSS can be used by the multiplexers 370a-370d such that the multiplexers 370a-370d route data to or from either the first segment 311 or the second segment 312.

In an instance when a column address CA<i> indicates a column in the first or second core 320a, 320b, the segment select signal CSS controls the first multiplexer 370a such that the first multiplexer 370a electrically couples the first local I/O line 340a to the first global I/O line 330a. In addition, the segment select signal CSS controls the second multiplexer 370b such that the second multiplexer 370b electrically couples the second local I/O line 340b to the second global I/O line 330b. The segment select signal CSS also controls the third multiplexer 370c such that the third multiplexer 370c electrically couples the fifth local I/O line 340e to the first global I/O line 330a. The segment select signal CSS further controls the fourth multiplexer 370d such that the fourth multiplexer 370d electrically couples the sixth local I/O line 340f to the second global I/O line 330b. At the same time, the segment select signal CSS blocks the other data paths to the global I/O lines 330a, 330b via the third, fourth, seventh, and eighth local I/O lines 340c, 340d, 340g, 340h.

In another instance when a column address CA<i> indicates a column in the third or fourth core 320c, 320d, the segment select signal CSS controls the first multiplexer 370a such that the first multiplexer 370a electrically couples the fourth local I/O line 340d to the first global I/O line 330a. In addition, the segment select signal CSS controls the second multiplexer 370b such that the second multiplexer 370b electrically couples the third local I/O line 340c to the second global I/O line 330b. The segment select signal CSS also controls the third multiplexer 370c such that the third multiplexer 370c electrically couples the eighth local I/O line 340h to the first global I/O line 330a. The segment select signal CSS further controls the fourth multiplexer 370d such that the fourth multiplexer 370d electrically couples the seventh local I/O line 340g to the second global I/O line 330b. At the same time, the segment select signal CSS blocks the other data paths to the global I/O lines 330a, 330b via the first, second, fifth, and sixth local I/O lines 340a, 340b, 340e, 340f.

The global redundant sub-array 350 includes columns of memory cells that can replace defective columns in the first to fourth cores 320a-320d. The global redundant sub-array 350 can be provided with its own sense amplifiers 327a, 327b. Data digits may be read from or written to the global redundant sub-array 350 directly via a separate set of global I/O lines and local I/O lines.

In the illustrated embodiment, the global redundant sub-array 350 may have the same configuration as one of the cores 320a-320d, but have a smaller number of data lines than the number of data lines in each of the cores 320a-320d. In one embodiment, the number of data lines in the global redundant sub-array 350 can be half of the number of data lines in each of the cores 320a-320d. For example, where each of the cores 320a-320d includes 256 data lines (32 columns), the global redundant sub-array 350 may include 128 data lines (16 columns).

In other embodiments, the global redundant sub-array 350 may include additional data lines such that the number of data lines in the global redundant sub-array 350 is greater than half of the number of data lines in each of the cores 320a-320d and less than the number of data lines in each of the cores 320a-320d. For example, where each of the cores 320a-320d includes 256 data lines (32 columns), the global redundant sub-array 350 may include 136 to 248 data lines (17 to 31 columns). The positions of the global redundant sub-arrays 250 can vary widely, depending on the design of the bank. In certain embodiments, the global redundant sub-arrays can be consolidated into a single global redundant array.

Although only one global redundant sub-array 350 is illustrated in FIG. 3, each bank of the memory device can include more, such as four global redundant sub-arrays (for example, 16×4=64 columns) of the same configuration, as shown in FIG. 2A. The four global redundant sub-arrays may form a global redundant array that can collectively repair one of the two segments of one of the sub-arrays 210 (four 16-column cores=64 columns) in its entirety when there is a defective local I/O line that prevents access to the segment. The details of repair schemes using the global redundant sub-array 350 will be described later.

The local redundant arrays 360a, 360b may include a column(s) of memory cells that can replace a defective column(s) in the cores 320a-320d. The local redundant arrays 360a, 360b may have a smaller number of columns than the number of columns in one of the cores 320a-320d. The local redundant arrays 360a, 360b can be provided with their own sense amplifiers 328a, 328b. Data digits may be read from or written onto the local redundant array 360a, 360b directly via a separate set of global I/O lines and local I/O lines.

In the illustrated embodiment, the local redundant arrays 360a, 360b are positioned adjacent to the second and third cores 320b, 320c, respectively. A skilled artisan will, however, appreciate that the positions of the local redundant arrays 360a, 360b can vary widely, depending on the design of the memory device. The details of repair schemes using the local redundant arrays 360a, 360b will be described later.

During operation, the memory device is provided with an activation command by an external device (for example, a processor) to activate one or more rows and is provided with a row address. The row address may be used by the memory device to select a group of access lines that are coupled to rows of memory cells.

The memory device may also be provided by the external device with a column address for read or write operation. In one embodiment, a column address may include a number of bits. One of the bits (for example, the most significant bit) may be used to select one of the sub-arrays in a bank. The other bits of the column address can be used to select one of the columns in the selected sub-array. In the illustrated embodiment, a column address can collectively select eight (8) adjacent data lines in one of the cores 320a-320d. For example, a column address can select four top data lines and four bottom data lines alternating with one another in one of the cores 320a-320d.

During read operation, the memory cells coupled to the selected data lines and access line are electrically coupled to a respective one of the sense amplifiers 325a-325d. The sense amplifiers 325a-325d detect the data levels stored in the memory cells. Suppose that eight memory cells in the first core 320a are selected. The data levels of the selected memory cells are detected by the first and fifth sense amplifiers 325a, 325e. The data digits determined by the first sense amplifier 325a are transmitted to the first and second local I/O lines 340a, 340b. The data digits determined by the fifth sense amplifier 325e are transmitted to the fifth and sixth local I/O lines 340e, 340f.

The segment selection circuit 380 may decode one of the bits (for example, the second most significant bit) of the column address, and provide a segment select signal CSS to the first to fourth multiplexers 370a-370d. The first multiplexer 370a electrically couples the first local I/O line 340a to the first global I/O line 330a via the first read/write gap circuits 375a. In addition, the second multiplexer 370b electrically couples the second local I/O line 340b to the second global I/O line 330b via the second read/write gap circuits 375b. The third multiplexer 370c electrically couples the fifth local I/O line 340e to the first global I/O line 330a via the third read/write gap circuits 375c. The fourth multiplexer 370d electrically couples the sixth local I/O line 340f to the second global I/O line 330b via the fourth read/write gap circuit 375d.

Thus, two data digits from the first core 320a are routed to the first global I/O line 330a via the first sense amplifier 325a, the first local I/O line 340a, the first multiplexer 370a, and the first read/write gap circuit 375a. In addition, two other data digits from the first core 320a are routed to the second global I/O line 330b via the first sense amplifier 325a, the second local I/O line 340b, the second multiplexer 370b, and the second read/write gap circuit 375b. Furthermore, two additional data digits from the first core 320a are routed to the first global I/O line 330a via the fifth sense amplifier 325e, the fifth local I/O line 340e, the third multiplexer 370c, and the third read/write gap circuit 375c. Two other data digits from the first core 320a are routed to the second global I/O line 330b via the fifth sense amplifier 325*e*, the sixth local I/O line 340*f,* the fourth multiplexer 370*d,* and the fourth read/write gap circuit 375*d.*

During a write operation, data digits are transferred from the global I/O lines 330*a,* 330*b* to the local I/O lines 340*a-* 340*h* via the read/write gap circuits 375*a-*375*d* and the multiplexers 370*a-*370*d* in a manner reverse to that described above with respect to the read operation. The data digits are then written to the memory cells coupled to the selected data lines and access line.

During production of the memory device described above, a test may be performed to determine if there is any defect in the memory device. Some of these defects in the memory device can be in, for example, one or more local I/O lines and/or one or more columns in the sub-arrays of a memory bank.

In one instance when one or more local I/O lines in the memory device have a defect, a segment (that may include two cores) that uses the defective local I/O line for data transmission cannot be used. Such a segment can be replaced in its entirety with the global redundant array in the bank. In the embodiment described above in connection with FIG. 3, the four global redundant sub-arrays in a bank may collectively repair one of the two segments 311, 312 in the sub-array 310, that is, two adjacent cores (two 32 column cores having a total of 64 columns), when there is a defective local I/O line that prevents access to the segment 311 or 312. It should also be noted that the four global redundant sub-arrays can be used for replacing a segment in other sub-arrays in the bank.

In the embodiment described above, each of the local I/O lines 340*a-*340*h* is used to provide a data path between a global I/O line 330*a,* 330*b* and one of the segments 311, 312 in the sub-array 310 in FIG. 3. Thus, if a local I/O line 340*a-*340*d* is defective, only the segment 311, 312 that uses the defective local I/O line needs to be repaired with the global redundant array. Thus, the total number of columns in the global redundant array (that is, four global redundant sub-arrays 350 in the context of the embodiment of FIG. 3) may be the same as the number of columns (for example, 64 columns) in one of the segments 311, 312. In contrast, in the conventional memory device described above in connection with FIG. 2C, the total number of columns in the global redundant array (that is, four global redundant sub-arrays 250), needs to be the same as the number of columns (for example, 128 columns) in one of the sub-arrays.

Thus, each memory bank of the embodiment described above may include a smaller number of columns in the global redundant array than the memory bank of the conventional memory device described above in connection with FIG. 2C. Thus, the configuration of the bank in the embodiment can significantly reduce the die space for the global redundant array. In addition, since a local I/O line 340*a-*340*d* is only coupled to a segment 311, 312, the length of the local I/O line may also be shortened, which can reduce power consumption and enhance the speed of the memory device.

In another instance when there is a first defective column (which includes at least one defective data line) in one of the segments 311, 312 of the sub-array 310, the first defective column can be replaced with a global redundant column (hereinafter, referred to as a "replacement column") in one of the global redundant sub-arrays 350 in the bank.

In the illustrated embodiment, each global redundant column may be mapped to either of two column addresses in each sub-array 310. In an embodiment where each sub-array includes 128 columns and the global redundant array includes 64 columns, a first global redundant column may be mapped to either a first (1st) column address in the first segment 311 or a sixty-fifth (65th) column address in the second segment 312. Similarly, a sixth fourth global redundant column may be mapped to a sixty-fourth (64th) column in the first segment 311 or a one hundred twenty eighth (128th) column in the second segment 312. A skilled artisan will appreciate that the column address of the first defective column can be mapped in any suitable manner to provide an access to the replacement column when there is a request to access the first defective column.

In yet another instance when the other segment of sub-array 310 or another sub-array in the bank has a second defective column with same address, only one of the columns can be repaired with a global redundant column. The second defective column may be repaired with a local redundant column.

Figure 2C:
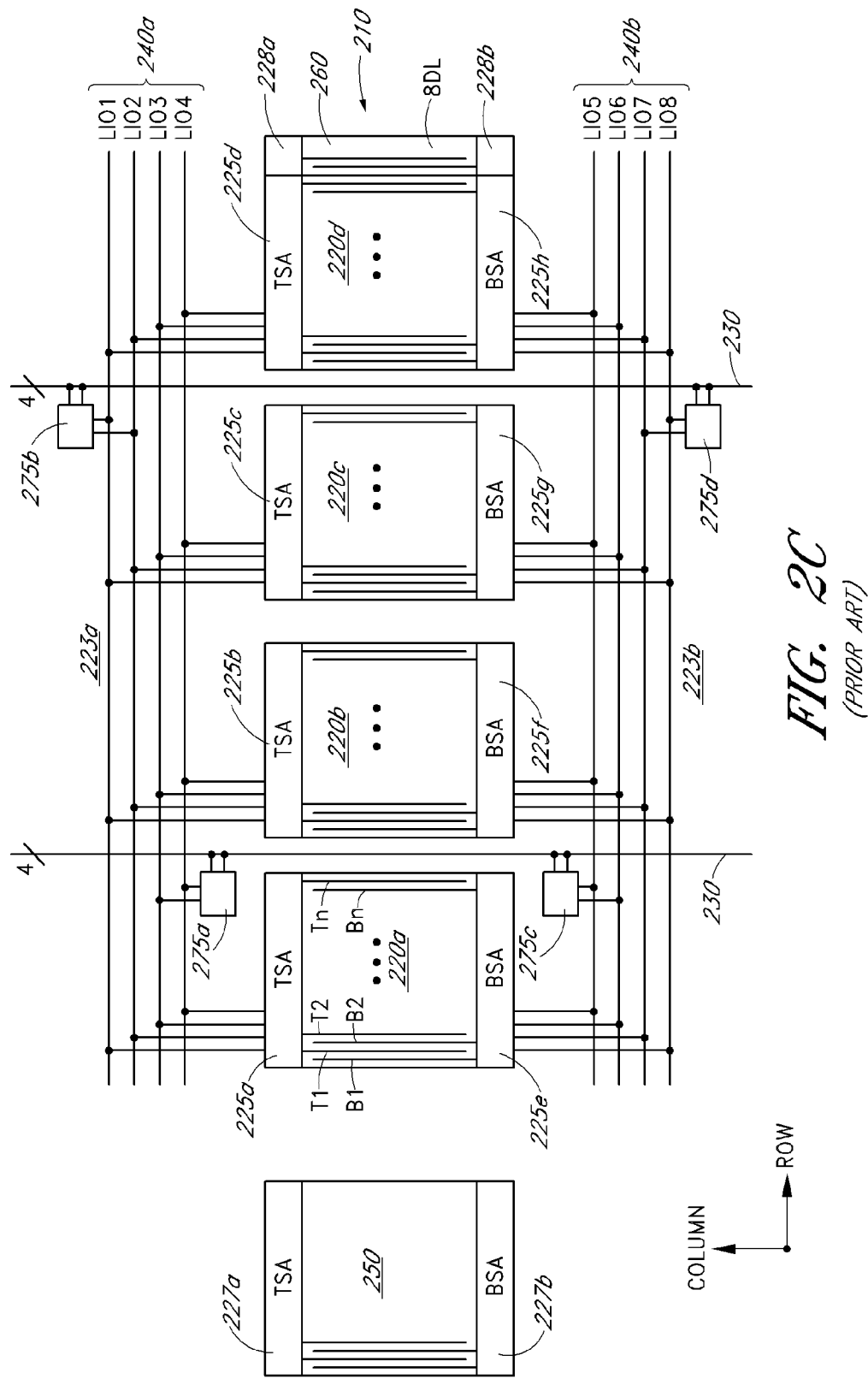
FIG. 2C is a block diagram of one of the sub-arrays of FIG. 2B.

In the embodiments described above, local I/O line defects can be repaired with a smaller number of global redundant columns, compared to the conventional device described in connection with FIG. 2C. In the embodiments where the number of global redundant columns is at least half of the number of columns in a sub-array, the manufacturing yield of such a memory device should be at least the same as the conventional architecture. In another embodiment where the number of available global redundant columns is the same as the number of columns in a sub-array, the manufacturing yield of such a memory device should be significantly enhanced because two defective local I/O lines can be repaired at the same time.

In some of the embodiments described above, the global redundant array may include more columns than it needs to repair a single local I/O line defect (for example, each of the four global redundant array includes a total of 68 to 124 columns while only 64 columns are required for the repair of a defective local I/O line). In such embodiments, a local I/O line defect and column defects may be repaired simultaneously with the global redundant columns, which can enhance the yield.

One of ordinary skill in the art will appreciate that the numbers provided above are exemplary, and similar principles may be applied to instances with different numbers of elements. One of ordinary skill in the art will appreciate that this technique may be applied to reducing the number of global redundant columns by more than half, for example, by dividing the number of global redundant columns in half another time for a reduction of three fourths. One of ordinary skill in the art will also appreciate that while this embodiment describes redundant columns, substantially similar methods can be used to reduce the number of redundant rows in certain architectures.

Reducing the number of global redundant columns by about a factor of two may provide several advantages, while significantly increasing yield with the global redundant columns. For example, this technique may lead to improved speed and performance, which may result from driving signals shorter physical distances, reducing the capacitance driven by certain gates, or combinations of the same. As another example, reducing the number of redundant columns may result in a reduction in the physical chip area (global redundant sub-array 350 may occupy roughly half of the physical area of global redundant sub-array 250), which may be particularly significant if global redundant sub-arrays are part of a critical dimension of the die. Another advantage may be a reduction in power consumption, which may be related to switching less wire capacitance, switching less gate capacitance, and occupying less physical area.

The embodiments above are described in the context of DRAM. A skilled artisan will, however, appreciate that the embodiments can also be adapted for any other types of memory devices having the same or similar problems.

A memory device according to the embodiments described above can be incorporated in various electronic devices. Examples of the electronic devices can include, but are not limited to, consumer electronic products, electronic circuits, electronic circuit components, parts of the consumer electronic products, electronic test equipments, etc. Examples of the consumer electronic products include, but are not limited to, a mobile phone, a telephone, a television, a computer monitor, a computer, a hand-held computer, a personal digital assistant (PDA), a microwave, a refrigerator, a stereo system, a cassette recorder or player, a DVD player, a CD player, a VCR, an MP3 player, a radio, a camcorder, an optical camera, a digital camera, a washer, a dryer, a washer/dryer, a copier, a facsimile machine, a scanner, a multi functional peripheral device, a wrist watch, a clock, etc. Further, the electronic device can include unfinished products.

One embodiment is an apparatus that includes a memory array including a sub-array that includes a first number of columns of memory cells; one or more global input/output (I/O) lines shared by the first number of columns for carrying of data to or from the sub-array; and one or more multiplexers/demultiplexers. Each of the multiplexers/demultiplexers is electrically coupled to one or more, but not all, of the global I/O lines. The apparatus also includes a plurality of local I/O lines. Each of the local I/O lines is configured to provide a data path between one of the multiplexers/demultiplexers and one or more, but less than the first number, of the columns in the sub-array. Two or more of the local I/O lines are multiplexed to one of the global I/O lines via one of the multiplexers/demultiplexers. One of the global I/O lines is demultiplexed to two or more of the local I/O lines via one of the multiplexers/demultiplexers.

Another embodiment is a memory device that includes: a memory array including a plurality of sub-arrays, each of the plurality of sub-arrays including a first number of columns; one or more global input/output (I/O) lines, wherein the one or more global I/O lines are configured to be shared for data transmission by the first number of columns in one of the sub-arrays; and a global redundant array including a second number of redundant columns configured to replace one or more defective columns in the plurality of sub-arrays, wherein the second number is less than the first number.

Yet another embodiment is a method of making a memory device. The method includes: providing a memory array including a plurality of sub-arrays, wherein the sub-arrays include a first sub-array that includes a first number of columns of memory cells, the first number of columns being configured to share the same global input/output (I/O) lines for data transmission, wherein the first sub-array includes a first segment and a second segment, and wherein the memory array is provided with a plurality of local I/O lines, each of which is electrically coupled to the columns in either the first or second segment. The method also includes testing the memory array to determine if any of the local I/O lines is defective; and mapping column addresses indicative of the columns in a segment that is coupled to a defective local I/O line to global redundant columns in a global redundant array.

Although this invention has been described in terms of certain embodiments, other embodiments that are apparent to those of ordinary skill in the art, including embodiments that do not provide all of the features and advantages set forth herein, are also within the scope of this invention. Moreover, the various embodiments described above can be combined to provide further embodiments. In addition, certain features shown in the context of one embodiment can be incorporated into other embodiments as well. Accordingly, the scope of the present invention is defined only by reference to the appended claims.

I claim:

1. An apparatus comprising:
   a memory array comprising a sub-array of regular columns of regular memory cells and a global redundant sub-array of redundant columns of redundant memory cells, the sub-array having a greater number of regular columns than the total number of redundant columns of the global redundant sub-array;
   a plurality of local input/output (I/O) lines, each of the local I/O lines configured to provide a data path between a global I/O line and a portion of the regular columns that is less than all of the regular columns; and
   a multiplexer configured to selectively electrically couple a selected local I/O line of the plurality of the local I/O lines to the global I/O line.

2. The apparatus of claim 1, wherein the apparatus is configured to replace the portion of the regular columns corresponding to the data path that would ordinarily be provided by the selected local I/O line in its entirety by redundant columns of the global redundant sub-array when the selected local I/O line is defective.

3. The apparatus of claim 1, wherein the sub-array of regular columns is divided into a first segment and a second segment such that the first segment and the second segment include the same number of columns as each other, and wherein each of the segments comprises one or more cores.

4. The apparatus of claim 1, further comprising one or more local redundant arrays, each of the local redundant arrays comprising columns of redundant memory cells, the total number of columns in each of the local redundant arrays being less than the number of regular columns in the sub-array, wherein one or more of the columns of redundant memory cells of the local redundant arrays are configurable to replace defective columns in the memory array.

5. The apparatus of claim 1, wherein the regular columns of the sub-array are grouped into a first segment and a second segment, wherein the plurality of local I/O lines comprise a first local I/O line electrically coupled to the first segment and second local I/O line electrically coupled to the second segment, and wherein the multiplexer is configured to selectively electrically couple the first segment or the second segment to the global I/O line.

6. The apparatus of claim 1, wherein the plurality of local I/O lines comprise a first local I/O line extending across a first region adjacent the sub-array and a second local I/O line extending adjacent a second region adjacent the sub-array and across only a portion of the first region.

7. The apparatus of claim 1, wherein the total number of redundant columns of the global redundant sub-array is less than or equal to half of the number of regular columns of the sub-array.

8. The apparatus of claim 1, wherein the sub-array is embodied in dynamic random access memory.

9. The apparatus of claim 1, wherein the multiplexer is bi-directional.

10. An apparatus comprising:
    a memory comprising a sub-array having a first number of columns of regular memory elements and a global redundant sub-array comprising redundant columns of redundant memory elements;
    one or more global input/output (I/O) lines corresponding to the first number of columns; and
    a plurality of local I/O lines configured to provide a portion of a bi-directional data path between a portion of the columns of regular memory elements and the one or more global I/O lines, the portion of columns of regular memory elements being less than all of the columns of regular memory elements of the sub-array, wherein one of two or more of the plurality of local I/O lines is selectively electrically coupleable to one of the one or more global I/O lines.

11. The apparatus of claim 10, wherein the global redundant sub-array has fewer total redundant columns than the first number of columns.

12. The apparatus of claim 10, wherein the first number of columns of the sub-array is divided into a first segment and a second segment such that the first segment and second segment include the same number of columns as each other.

13. The apparatus of claim 12, wherein the apparatus is configured to replace a defect in one of the plurality of local I/O lines by replacing only the segment corresponding to the defective local I/O line.

14. The apparatus of claim 12, further comprising a segment selection circuit configured to cause either data corresponding to a first segment or data corresponding to a second segment to be selectively electrically coupled to the one or more global I/O lines.

15. The apparatus of claim 10, wherein the plurality of local I/O lines comprises a first local I/O line extending across a first region adjacent the sub-array and a second local I/O line extending adjacent a second region adjacent the sub-array and across only a portion of the first region.

16. An apparatus comprising:
   a first global input/output (I/O) line;
   a second global I/O line;
   a first segment of an array of memory cells;
   a second segment of the array of memory cells;
   a first local I/O line extending across a first region adjacent the first segment, the first local I/O line electrically coupled to memory cells of the first segment;
   a second local I/O line extending across the first region adjacent the first segment and across a portion of a second region adjacent the second segment, wherein the portion is less than all of the second region, the second local I/O line electrically coupled to memory cells of the first segment;
   a first multiplexer configured to selectively electrically couple the first local I/O line to the first global I/O line when data for the first segment is selected; and
   a second multiplexer configured to selectively electrically couple the second local I/O line to the second global I/O line when data for the first segment is selected.

17. The apparatus of claim 16, wherein the first segment comprises a first core of memory cells and a second core of memory cells, and wherein the first global I/O line extends in a gap between the first and second cores.

18. The apparatus of claim 17, wherein the first local I/O line and the second local I/O line each extend in a row direction, and wherein the global I/O line extends in a column direction in the gap.

19. The apparatus of claim 16, wherein the first local I/O line extends across a portion of the second region that is less than all of the second region.

20. The apparatus of claim 16, further comprising a segment selection circuit configured to generate a segment select signal, wherein the first multiplexer is configured to electrically couple either data corresponding to the first segment or data corresponding to the second segment to the first global I/O in response to the segment select signal.

* * * * *